(12) United States Patent
Yazdani et al.

(10) Patent No.: US 10,020,438 B2
(45) Date of Patent: Jul. 10, 2018

(54) MAGNETIC TOPOLOGICAL NANOWIRES

(71) Applicant: THE TRUSTEES OF PRINCETON UNIVERSITY, Princeton, NJ (US)

(72) Inventors: Ali Yazdani, Princeton, NJ (US); Andrei Bernevig, Lawrenceville, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 302 days.

(21) Appl. No.: 14/818,002

(22) Filed: Aug. 4, 2015

(65) Prior Publication Data

US 2016/0035470 A1    Feb. 4, 2016

Related U.S. Application Data

(60) Provisional application No. 62/032,921, filed on Aug. 4, 2014.

(51) Int. Cl.
| | |
|---|---|
| *H01L 29/82* | (2006.01) |
| *H01L 39/22* | (2006.01) |
| *B82Y 10/00* | (2011.01) |
| *H01L 39/12* | (2006.01) |
| *H01F 1/00* | (2006.01) |
| *G06N 99/00* | (2010.01) |

(52) U.S. Cl.
CPC .............. *H01L 39/22* (2013.01); *B82Y 10/00* (2013.01); *H01L 39/12* (2013.01); *G06N 99/002* (2013.01); *H01F 1/0072* (2013.01)

(58) Field of Classification Search
CPC ................................ H01L 43/08; H01L 39/22

USPC ....................... 257/421–427, E29.323; 438/3
See application file for complete search history.

(56) References Cited

U.S. PATENT DOCUMENTS

| | | | |
|---|---|---|---|
| 9,040,959 B2 | 5/2015 | Lutchyn et al. | |
| 2007/0194225 A1 | 8/2007 | Zorn | |
| 2012/0112168 A1 | 5/2012 | Bonderson et al. | |
| 2013/0246495 A1* | 9/2013 | Svore ..................... | B82Y 10/00 708/491 |
| 2013/0299783 A1* | 11/2013 | Lutchyn ................ | H01L 39/221 257/31 |
| 2014/0279822 A1* | 9/2014 | Bonderson ............. | B82Y 10/00 706/62 |

OTHER PUBLICATIONS

Akhmerov et al, "Electrically Detected Interferometry of Majorana Fermions in a Topological Insulator", Mar. 2009, in Journal of Physical Review Letters, vol. 102, Issue 21, 4 pgs.

(Continued)

*Primary Examiner* — Jami M Valentine
(74) *Attorney, Agent, or Firm* — Marshall, Gerstein & Borun LLP

(57) ABSTRACT

A magnetic topological nanowire structure comprises a superconductor and a quasi-1D magnetic nanowire. The quasi-1D magnetic nanowire is coupled to or embedded in the superconductor to produce a self-contained interaction resulting in a spatially separated pair of Majorana fermions. The pair of Majorana fermions corresponds to the topological superconductor and each of the pair of the Majorana fermions are localized near a respective endpoint of the nanowire.

15 Claims, 6 Drawing Sheets

(56) References Cited

OTHER PUBLICATIONS

Akhmerov et al, "Quantized Conductance at the Majorana Phase Transition in a Disordered Superconducting Wire", In Journals of Physical Review Letters, vol. 106, Issue 5, Nov. 2010, 7 pgs.
Aleshkin et al, "Exchange Enhancement of the g Factor in InAs|AlSb Heterostructures", In Semiconductors, vol. 42, Issue 7, Jul. 2008, 6 pgs.
Alexandrov et al, "Low-temperature Proximity Effect in Clean Metals with Repulsive Electron-electron Interaction", In Journals of Physical Review B, vol. 78, Issue 13, Oct. 2008, 4 pgs.
Alicea et al, "Non-Abelian Statistics and Topological Quantum Information Processing in 1D Wire Networks", In Nature Physics, Sep. 2010, 23 pgs.
Alicea, "Majorana Fermions in a Tunable Semiconductor Device", In Physical Review B, vol. 81, Issue 12, Dec. 2009, 10 pgs.
Alicea, Rep. Prog. Phys. 75, 076501 (2012).
Alicea, Y. Oreg, G. Refael, F. von Oppen, and M.P.A. Fisher, Nature Phys. 7,412(2011).
Beenakker et al, "Random-matrix Theory of Andreev Reflection from a Topological Superconductor", In Journal of Physical Review B, vol. 83, Issue 8, Feb. 2011, 13 pgs.
Beenakker, "Search for Majorana fermions in superconductors", Apr. 2012, 15 pgs.
Beenakker. *Annual Review of Condensed Matter Physics* 4, 113 (2013).
Berthod et al, "Tunneling Conductance and Local Density of States in Tight-Binding Junctions", Oct. 2011, In Journal of Physical Review B, 4 pgs.
Bolech et al, "Observing Majorana Bound States in p-wave Superconductors using Noise Measurements in Tunneling Experiments", Jun. 2007, In Journal of Physical Review Letters, vol. 98, Issue 23, 4 pgs.
Bonderson et al, "Detecting Non-Abelian Statistics in the v=5|2 Fractional Quantum Hall State", In Physical Review Letters, vol. 96, Issue 1, Feb. 2006, 5 pgs.
Bonderson et al, "Topological Quantum Buses: Coherent Quantum Information Transfer between Topological and Conventional Qubits", In Physical Review Letter, vol. 106, Issue 13, Mar. 2011, 5 pgs.
Braunecker, G.I. Japaridze, J. Klinovaja, and D. Loss, Phys. Rev. B 82, 045127 (2010).
Braunecker, P. Simon, and D. Loss, Phys. Rev. B 80, 165119.
Braunecker, P. Simon. *Physical Review Letters* 111, 147202 (2013).
Bravyi, "Universal Quantum Computation with the v=5|2 Fractional Quantum Hall State", In Physical Review A, vol. 73, Issue 4, Apr. 2006, 16 pgs.
Brouwer et al, "Probability Distribution of Majorana End-State Energies in Disordered Wires", In Physical Review Letter, Apr. 2011, 4 pgs.
Brouwer et al, "Topological Superconducting Phases in Disordered Quantum Wires with Strong Spin-Orbit Coupling", In Journal of Physical Review B, Issue 84, Feb. 2012, 6 pgs.
Budich, E. Ardonne. Phys. Rev. B 88, 075419 (2013).
Choy, T.-P., Edge, J. M., Akhmerov, A. R. & Beenakker, C. W. J. Majorana fermions emerging from magnetic nanoparticles on a superconductor without spin-orbit cou-pling. *Phys. Rev. B* 84, 195442 (2011).
Chung, S. B., Zhang, H.-J., Qi, X.-L. & Zhang, S.-C. Topo-logical superconducting phase and majorana fermions in half-metal/superconductor heterostructures. *Phys. Rev. B* 84, 060510 (2011).
Churchill, H. O. H. et al. Superconductor-nanowire devices from tunneling to the multichannel regime: Zero-bias os-cillations and magnetoconductance crossover. *Phys. Rev. B* 87, 241401 (2013).
Clarke et al, "Majorana Fermion Exchange in Quasi-One-Dimensional Networks", Jan. 2011, 8 pgs.
Crommie, C. P. Lutz, and D. M. Eigler, Science 262, 218 (1993).
Das Sarma et al, "Proposal to Stabilize and Detect Half-Quantum Vortices in Strontium Ruthenate Thin Films: Non-Abelian Braiding Statistics of Vortices in a px+ipy Superconductor", In Physical Review B, vol. 73, Issue 22, Oct. 2005, 5 pgs.
Das Sarma et al, "Screening and Elementary Excitations in Narrow-Channel Semiconductor Microstructures", In Journal of Physical Review B, vol. 32, Issue 2, Jul. 1985, 4 pgs.
Das Sarma et al, "Topologically Protected Qubits from a Possible Non-Abelian Fractional Quantum Hall State", In Physical Review Letters, vol. 94, Issue 16, Dec. 2004, 5 pgs.
Das Sarma, S., Sau, J. D. & Stanescu, T. D. Splitting of the zero-bias conductance peak as smoking gun evidence for the existence of the majorana mode in a superconductor-semiconductor nanowire. *Phys. Rev. B* 86, 220506 (2012).
Das, A. et al. Zero-bias peaks and splitting in an al-inas nanowire topological superconductor as a signature of ma-jorana fermions. *Nat. Phys.* 8, 887-895 (2012).
de Gennes, "Boundary Effects in Superconductors", In Journals of Reviews of Modern Physics, Jan. 1964, 13 pgs.
Deng, M. T. et al. Anomalous zero-bias conductance peak in a nbinsb nanowirenb hybrid device. *Nano Lett.* 12, 6414-6419 (2012).
Doh et al, "Tunable Supercurrent through Semiconductor Nanowires", In Science, vol. 309, Issue 5732, Jul. 2005, 12 pgs.
Duckheim, M. & Brouwer, P. W. Andreev reflec-tion from noncentrosymmetric superconductors and majo-rana bound-state generation in half-metallic ferromagnets. *Phys. Rev. B* 83, 054513 (2011).
Dumitrescu, E. & Tewari, S. Topological properties of the time-reversal-symmetric kitaev chain and applications to organic superconductors. *Phys. Rev. B* 88, 220505 (2013).
Fang, M. J. Gilbert, B. A. Bernevig. *Physical Review Letters* 112, 106401 (2014).
Finck, D. J. Van Harlingen, P. K. Mohseni, K. Jung, X. Li., Anomalous modulation of a zero-bias peak in a hybrid nanowire-superconductor device, *Physical Review Letters* 110, 126406 (2013).
Flensberg, "Non-Abelian Operations on Majorana Fermions via Single Charge Control", In Physical Review Letters, vol. 106, Issue 9, Nov. 2010, 4 pgs.
Flensberg, K. Tunneling characteristics of a chain of ma-jorana bound states. *Phys. Rev. B* 82, 180516 (2010).
Folsch, P. Hyldgaard, R. Koch, and K. H. Ploog, Phys. Rev. Lett. 92, 056803 (2004).
Franke, G. Schulze, J. I. Pascual. *Science* 332, 940 (2011).
Franz, "Viewpoint: Race for Majorana Fermions", In Physics, vol. 3, Issue 24, Mar. 2010, 3 pgs.
Fu and C.L. Kane, Phys. Rev. B 79, 161408(R) (2009).
Fu et al, "Josephson Current and Noise at a Superconductor-Quantum-Spin Hall Insulator-Superconductor Junction", In Physical Review B, vol. 79, Issue 16, Apr. 2008, 4 pgs.
Fu et al, "Probing Neutral Majorana Fermion Edge Modes with Charge Transport", Mar. 2009, In Journal of Physical Review Letters, vol. 102, Issue 21, 4 pgs.
Fu et al, "Superconducting Proximity Effect and Majorana Fermions at the Surface of a Topological Insulator", In Physical Review Letters, vol. 100, Issue 9, Apr. 2008, 4 pgs.
Fujimoto, "Topological Order and Non-Abelian Statistics in Noncentrosymmetric s-Wave Superconductors", Mar. 2008, 4 pgs.
G. Moore, N. Read. *Nuclear Physics* B 360, 362 (1991).
Gangadharaiah et al, "Majorana Edge States in Interacting One-Dimensional Systems", In Journals of Physical Review Letters, vol. 107, Issue 3, Dec. 2010, 5 pgs.
Gibertini et al, "Local density of states in metal topological superconductor hybrid systems", Phys. Rev. B 85, 144525, Apr. 2012, 11 pgs.
Gruzberg et al, "Localization in Disordered Superconducting Wires with Broken Spin-Rotation Symmetry", In Journal of Physical Review B, vol. 71, Issue 24, Dec. 2004, 29 pgs.
Halperin, Y. Oreg, A. Stern, G. Refael, J. Alicea, and F. von Oppen, Phys. Rev. B 85, 144501 (2012).
Hassler et al, "Anyonic Interferometry without Anyons: How a Flux Qubit Can Read Out a Topological Qubit", In New Journal of Physics 12, Dec. 2010, 13 pgs.
Hassler et al, "The Top-Transmon: A Hybrid Superconducting Qubit for Parity-Protected Quantum Computation", In Journal of Physics, vol. 13, Sep. 2011, 14 pgs.

(56) References Cited

OTHER PUBLICATIONS

Hui et al., "Majorana Fermions in Ferromagnetic Chains on the Surface of Bulk Spin-Orbit Coupled S-Wave Superconductors," (2014).
Ivanov, "Non-Abelian Statistics of Half-Quantum Vortices in p-Wave Superconductors", In Physical Review Letters, vol. 86, Issue 2, May 2000, 5 pgs.
Jiang et al, "Interface between Topological and Superconducting Qubits", In Physical Review Letters, vol. 106, Issue 13, Mar. 2011, 4 pgs.
Kells, D. Meidan, "Near-zero-energy end states in topologically trivial spin-orbit coupled superconducting nanowires with a smooth confinement", In Physical Review B, vol. 86, (2012), 5 pgs.
Kim, Y., Cheng, M., Bauer, B., Lutchyn, R. M. & Das Sarma, S. Helical order in one-dimensional magnetic atom chains and possible emergence of majorana bound states. *Phys. Rev. B* 90, 060401 (2014).
Kitaev, "Fault-tolerant Quantum Computation by Anyons", In Annals of Physics, vol. 303, Issue 1, Jan. 2003, 29 pgs.
Kitaev, "Unpaired Majorana Fermions in Quantum Wires", In Physics—Uspekhi, vol. 44, Oct. 2001, 7 pgs.
Klinovaja, J., Stano, P., Yazdani, A. & Loss, D. Topo-logical superconductivity and majorana fermions in rkky systems. *Phys. Rev. Lett.* 111, 186805 (2013).
Kresse, J. Hafner. *Phys. Rev. B* 47, 558 (1993).
Law et al, "Majorana Fermion Induced Resonant Andreev Reflection", Jul. 2009, In Journal of Physical Review Letters, vol. 103, Issue 23, 4 pgs.
Lee et al. *Physical Review Letters* 109, 186802 (2012).
Lee, "Proposal for Creating a Spin-polarized px+ipy State and Majorana Fermions", Jul. 2009, 2 pgs.
Levi, "The Expanding Search for Majorana Particles". Physics Today, Mar. 2011, 1 pgs.
Li, T. Neupert, B. A. Bernevig, A. Yazdani, Majornan Zero Modes on a Necklace, (2014).
Linder et al, "Unconventional Superconductivity on a Topological Insulator", In Physical Review Letters, vol. 104, Issue 6, Feb. 2010, 4 pgs.
Liu, A. C. Potter, K. T. Law, P. A. Lee. *Physical Review Letters* 109, 267002.
Liu et al., "Majorana Fermion Induced Nonlocal Current Correlations in Spin-Orbit Coupled Superconducting Wires", Phys. Rev. B 88, (2013).
Lutchyn et al, "Interacting Topological Phases in Multiband Nanowires", In Journals of Physical Review B, vols. 84, Issue 21, Dec. 2011, 7 pgs.
Lutchyn et al, "Majorana Fermions and a Topological Phase Transition in Semiconductor-Superconductor Heterostructures", In Physical Review Letters, vol. 105, Issue 7, Aug. 2010, 5 pgs.
Lutchyn et al, "Search for Majorana Fermions in Multiband Semiconducting Nanowires", In Physical Review Letters, vol. 106, Issue 12, Feb. 2011, 4 pgs.
Majorana, "Teoria Simmetrica Dell elettrone E Del Positrone", In Nuovo Cimento, vol. 14, Issue 4, Apr. 1937, 14 pgs.
Mao et al, "Hole-Doped Semiconductor Nanowire on Top of an s-Wave Superconductor: A New and Experimentally Accessible System for Majorana Fermions", In Physical Review Letters, vol. 108, Issue 17, Apr. 2012, 5 pgs.
McMillan, "Tunneling Model of the Superconducting Proximity Effect", In Journals of Physical Review, vol. 175, Issue 2, Nov. 1968, 6 pgs.
Meng et al., "Helical Nuclear Spin Order in Two-Subband Quantum Wires", In Physical Review B 87, (2013).
Menzel, Y. Mokrousov, R. Wieser, J. E. Bickel, E. Vedme-denko, S. Blugel, S. Heinze, K. von Bergmann, A. Kubetzka, and R. Wiesendanger, Information transfer by vector spin chiral-ity in finite magnetic chains, Phys. Rev. Lett. 108, 197204 (2012).
Monkhorst, J. D. Pack. *Phys. Rev. B* 13, 5188 (1976).

Mourik, V. et al. Signatures of majorana fermions in hybrid superconductor-semiconductor nanowire devices. *Science* 336, 1003-1007 (2012).
Nadj-Perge et al, "Spin-orbit Qubit in a Semiconductor Nanowire", In Nature—International Weekly Journal of Science, vol. 468, Dec. 2010, 11 pgs.
Nadj-Perge, S. et al. Observation of majorana fermions in ferromagnetic atomic chains on a superconductor. *Science* 346, 602-607 (2014).
Nadj-Perge, S., Drozdov, I. K., Bernevig, B. A. & Yazdani, A. Proposal for realizing majorana fermions in chains of magnetic atoms on a superconductor. *Phys. Rev. B* 88, 020407 (2013).
Nakosai et al., "Two-Dimensional p-wave Superconducting States with Magnetic Moments on a Conventional s-wave Superconductor", *Phys. Rev. B* 88, (2013).
Nayak et al, "Non-Abelian Anyons and Topological Quantum Computation", In Reviews of Modern Physics, vol. 80, Issue 3, Sep. 2008, 73 pgs.
Nilius, T. M. Wallis, and W. Ho, Science 297, 1853 (2002).
Nilsson et al, "Giant, Level-Dependent g Factors in InSb Nanowire Quantum Dots", In Nano Letters, vol. 9, Issue 9, Aug. 2009, 6 pgs.
Nilsson et al, "Splitting of a Cooper Pair by a Pair of Majorana Bound States", Aug. 2008, In Journal of Physical Review Letters, vol. 101, Issue 12, 4 pgs.
Oreg et al, "Helical Liquids and Majorana Bound States in Quantum Wires", In Physical Review Letters, vol. 105, Issue 17, Jun. 2010, 5 pgs.
Pientka et al., "Unconven-tional topological phase transitions in helical shiba chains", *Phys. Rev. B* 89, (2014).
Pietzsch, A. Kubetzka, M. Bode, R. Wiesendanger. *Physical Review Letters* 92, 057202 (2004).
Pikulin, J. P. Dahlhaus, M. Wimmer, H. Schomerus, C. W. J. Beenakker. *New J. Phys.* 14, 125011 (2012).
Potter et al, "Erratum: Engineering a p+ip Superconductor: Comparison of Topological Insulator and Rashba Spin-orbit-coupled Materials", In Journal of Physical Review B, vol. 84, Issue 5, Aug. 2011, 2 pgs.
Potter et al, "Majorana End-States in Multi-band Microstructures with Rashba Spin-Orbit Coupling", In Physical Review, vol. 83, Issue 9, Nov. 2010, 9 pgs.
Potter et al, "Multichannel Generalization of Kitaev's Majorana End States and a Practical Route to Realize Them in Thin Films", In Physical Review Letters, vol. 105, Issue 22, Nov. 2010, 5 pgs.
Potter et al, "Topological Superconductivity and Majorana Fermions in Metallic Surface-States", Phys. Rev. B 85, 094516, Jan. 2012, 9 pgs.
Qi et al, "Chiral Topological Superconductor from the Quantum Hall State", In Physical Review, vol. 82, Issue 18, Mar. 2010, 5 pgs.
Read et al, "Paired States of Fermions in Two Dimensions with Breaking of Parity and Time-Reversal Symmetries and the Fractional Quantum Hall Effect", In Journal of Physical Review B, vol. 61, Issue 15, Jan. 2000, 35 pgs.
Rokhinson et al., "The fractional ac josephson effect in a semiconductor-superconductor nanowire as a signature of majorana particles", in *Nat. Phys.* 8, 795-799 (2012).
Rusinov, Sov. Phys. JETP 29, 1101 (1969).
Rusinov. *Sov. Phys. JETP* 9, 85 (1969).
Ryu, S., Schnyder, A. P., Furusaki, A. & Ludwig, A. W. W. Topological insulators and superconductors: tenfold way and dimensional hierarchy. *New Journal of Physics* 12, 065010 (2010).
Santos et al., "Superconductivity on the Surface of Topological Insulators and in Two-dimensional Noncentrosymmetric Materials", in Phys. Rev. B 81, (2010).
Sau et al, "A Generic New Platform for Topological Quantum Computation Using Semiconductor Heterostructures", In Physical Review Letters, vol. 104, Issue 4, Jan. 2010, 4 pgs.
Sau et al, "Non-abelian Quantum Order in Spin-Orbit-coupled Semiconductors: The Search for Topological Majorana Particles in Solid State Systems", In Physical Review Letters, vol. 82, Issue 21, Jun. 2010, 59 pgs.
Sau et al, "Probing Non-Abelian Statistics with Majorana Fermion Interferometry in Spin-Orbit-Coupled Semiconductors", Aug. 2011, In Journal of Physical Review B, vol. 84, Issue 8, 8 pgs.

(56) References Cited

OTHER PUBLICATIONS

Sau et al, "Universal Quantum Computation in a Semiconductor Quantum Wire Network", In Physical Review A, vol. 82, Issue 5, Nov. 2010, 7 pgs.
Schnyder et al., "Classification of topological insulators and superconduc-tors in three spatial dimensions", in *Phys. Rev. B* 78, 195125 (2008).
Schnyder, A., Ryu, S., Furusaki, A. & Ludwig, A. Classifi-cation of topological insulators and superconductors. *AIP Conf. Proc.* 1134, 10-21 (2009).
Sela et al, "Majorana Fermions in Strongly Interacting Helical Liquids", In Journals of Physical Review B, vol. 84, Issue 8, Aug. 2011, 7 pgs.
Serra, "Majorana modes and complex band structure of quantum wires", Oct. 2012, 8 pgs.
Service, "Search for Majorana Fermions Nearing Success at Last?", In Science, vol. 332, Apr. 2011, 3 pgs.
Shiba. *Progress of Theoretical Physics* 40, 435 (1968).
Silaev et al, "Topological Superfluid 3He—B: Fermion Zero Modes on Interfaces and in the Vortex Core", Dec. 2010, In Journal of Low Temperature Physics, vol. 161, Issue 5-6, 14 pgs.
Stanescu et al., "Majorana Fermions in Semiconductor Nanowires: Fundamentals, Modeling and Experiment", J. Phys.: Condens. Matter 25, 233201 (2013).
Stanescu et al, "Majorana Fermions in Semiconductor Nanowires", Physical Review B 84, Oct. 2011, 29 pgs.
Stanescu et al, "Proximity Effect at the Superconductor-Topological Insulator Interface", In Journal of Physical Review B, vol. 81, Issue 24, Jun. 2010, 5 pgs.
Stern et al, "Geometric Phases and Quantum Entanglement as Building Blocks for Non-Abelian Quasiparticle Statistics", In Journal of Physical Review B, vol. 70, Issue 20, Oct. 2003, 17 pgs.
Stern et al, "Proposed Experiments to Probe the Non-Abelian v=5|2 Quantum Hall State", In Physical Review Letters, vol. 96, Issue 1, Sep. 2005, 5 pgs.
Stoudenmire et al, "Interaction Effects in Topological Superconducting Wires Supporting Majorana Fermions", In Journal of Physical Review B, vol. 84, Issue 1, Apr. 2011, 14 pgs.
Takei et al., "Microscopic theory for a ferromagnetic nanowire/superconductor heterostructure: Transport, fluctuations, and topological superconductiv-ity", *Phys. Rev. B* 86, 054521 (2012).
Takimoto and P. Thalmeier, J. Phys.: Conf. Ser. 150, 042202 (2009).
Tewari et al, "Quantum Computation using Vortices and Majorana Zero Modes of a px+ipy Superfluid of Fermionic Cold Atoms", Jun. 2006, In Physical Review Letters, vol. 98, Issue 1, 5 pgs.
Tewari et al, "Testable Signatures of Quantum Nonlocality in a Two-Dimensional Chiral p-Wave Superconductor", In Physical Review Letters, vol. 100, Issue 2, Dec. 2007, 4 pgs.
Tewari et al, "Topologically Non-trivial Superconductivity in Spin-orbit-coupled Systems: Bulk Phases and Quantum Phase Transitions", In New Journal of Physics, vol. 13, Jun. 2011, 21 pgs.
van Heck et al., "Coulomb Stability of the $4\pi$-periodic Josephson Effect of Majorana Fermions", Phys. Rev. B 84, 180502(R) (2011).
Vazifeh, M. M. & Franz, M. Self-organized topologi-cal state with majorana fermions. *Phys. Rev. Lett.* 111, 206802 (2013).
Wang, J. et al. Interplay between superconductivity and ferromagnetism in crystalline nanowires. *Nat. Phys.* 6, 389-394 (2010).
Wark, "The Hunt for Majorana Neutrinos Hots Up", *Nature* 510, 224 (2014).
Wilczek, "Majorana Returns", In Nature Physics, vol. 5, Sep. 2009, 5 pgs.
Wimmer et al, "Majorana Bound States without Vortices in Topological Superconductors with Electrostatic Defects", In Journals, Physical Review Letter, vol. 105, Issue 4, Sep. 2011, 8 pgs.
Wimmer et al, "Quantum Point Contact as a Probe of a Topological Superconductor", May 2011, In New Journal of Physics, vol. 13, 11 pgs.
Yazdani, B. A. Jones, C. P. Lutz, M. F. Crommie, and D. M. Eigler, Science 275, 1767 (1997).
Yazdani. *Visualizing Topological Quantum States: From Dirac to Majorana Fermions*, Presentation at Nobel Symposium on, "New Forms of Matter," Hogberga Gard, Lidingo, Sweden, (Jun. 13-15, 2014).
Zhang, C., Tewari, S., Lutchyn, R. M. & Das Sarma, S. px + ipy superfluid from s-wave interactions of fermionic cold atoms. Phys. Rev. Lett. 101, 160401 (2008).
Zhong, G. Overney, T. D. *Phys. Rev. B* 47, 95 (1993).
Ghosh et al, "Non-Abelian Topological Order in Noncentrosymmetric Superconductors with Broken Time-Reversal Symmetry", In Physical Review B, vol. 82, 184525, (2010), 10 pgs.

\* cited by examiner

MAGNETIC TOPOLOGICAL NANOWIRES

CROSS-REFERENCE TO RELATED APPLICATIONS

This application claims the benefit of U.S. Provisional Application No. 62/032,921, filed Aug. 4, 2014, which is incorporated by reference herein in its entirety.

STATEMENT OF GOVERNMENT SUPPORT

This invention was made with government support under Grants Numbers N00014-14-1-0330, N00014-11-1-0635 and N00014-13-1-0661 awarded by the Office of Naval Research and Grants Numbers DMR-0819860 and DMR-0952428 awarded by the National Science Foundation. The government has certain rights in the invention.

FIELD OF THE DISCLOSURE

The following disclosure relates to a magnetic topological nanowire structure that produces a self-contained interaction resulting in a spatially separated pair of Majorana fermions.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Majorana fermions are the condensed matter analogs of elementary spin-½ particles originally proposed by Ettore Majorana. Majorana fermions are characterized, in part, by being their own anti-particles. Because of their unique quantum properties, researchers have known for some time that Majorana fermions can be implemented as a new form of electronic states of matter. And as such, researchers have known that Majorana fermions could have applications for information processing and computing, and in particular in quantum computation and storage.

The idea that a pair of Majorana fermions can be engineered in the laboratory grew from the theoretical observation that proximity induced superconductivity on the surface state of a topological insulator is topological in nature. Research showed that pairing, on a "spin-less" Fermi surface created by the spin-momentum locking of topological surface states, must effectively include a p-wave superconductor to satisfy the pair-wavefunction anti-symmetry requirement to produce a topological superconductor. This approach was later extended to systems in which a semiconductor nanowire, with strong spin orbit interactions in a parallel magnetic field, would be placed in contact with a superconductor.

The semiconductor nanowire system required fine-tuning of various parameters, such as the chemical potential of the system. Further, the semiconductor nanowire system required the application of an external magnetic field to produce the interaction required to produce the Majorana fermions within the nanowire. In turn, the semiconductor nanowire platform is complex and difficult to implement.

Despite the complexity, experimental efforts to create Majorana fermions using the semiconductor nanowire system have uncovered evidence for a zero bias peak (ZBP) in tunneling spectroscopy studies. Theoretically, such a zero bias peak could be a signature of presence of Majorana fermion. However, the ZBPs detected in such devices are believed to be caused by the Kondo effect or disorder, and not therefore indicative of the presence of Majorana fermions. Crucially, in order for the ZBP to be correctly identified as a Majorana fermion, it must appear at the end of the semiconductor nanowire. However, conventional experimental efforts have failed to provide evidence for the presence of Majorana fermions, because the zero bias peaks are not spatial separated.

Without isolation of the Majorana fermions in well-defined regions, creating useful devices, whether qubit devices or otherwise, is still allusive. In fact, without proving spatial isolation of the ZBP, one cannot confirm the presence of Majorana fermions.

SUMMARY

This summary is provided to introduce a selection of concepts in a simplified form that are further described below in the Detailed Description. This summary is not intended to identify key features or essential features of the claimed subject matter, nor is this summary intended to be used to limit the scope of the claimed subject matter.

According to an embodiment, a magnetic topological nanowire structure comprises a superconductor and a quasi-1D magnetic nanowire. The quasi-1D magnetic nanowire is coupled to or embedded in the superconductor to produce a self-contained interaction (called proximity effect) resulting in a spatially separated pair of Majorana fermions. The pair of Majorana fermions corresponds to the topological superconductor and each member of the pair of the Majorana fermions is located near a respective endpoint of the nanowire.

According to another embodiment, a magnetic topological structure comprises a superconductor and a two-dimensional magnetic thin film region. That thin film region is coupled to or embedded in the superconductor to produce self-contained interactions resulting in a band of Majorana fermions circulating around the edge of the two-dimensional thin film region. Multiple thin film regions may be formed with a single superconductor.

The features and advantages described in this summary and the following detailed description are not all-inclusive. Many additional features and advantages will be apparent to one of ordinary skill in the art in view of the drawings, specification, and claims hereof.

BRIEF DESCRIPTION OF THE DRAWINGS

This patent or patent application file contains at least one drawing executed in color. Copies of this patent or patent application publication with color drawing(s) will be provided by the United States Patent and Trademark Office upon request and payment of the necessary fee.

The Figures described below depict various aspects of the system and methods disclosed therein. It should be understood that each Figure depicts an embodiment of a particular aspect of the disclosed system and methods, and that each of the Figures is intended to accord with a possible embodiment thereof. Further, wherever possible, the following description refers to the reference numerals included in the following Figures, in which features depicted in multiple Figures are designated with consistent reference numerals.

The present embodiments are not limited to the precise arrangements and instrumentalities shown. The Figures depict example embodiments for purposes of illustration only. One skilled in the art will readily recognize from the following discussion that alternative embodiments of the systems and methods illustrated herein may be employed without departing from the principles of the invention described herein.

Figure 1:
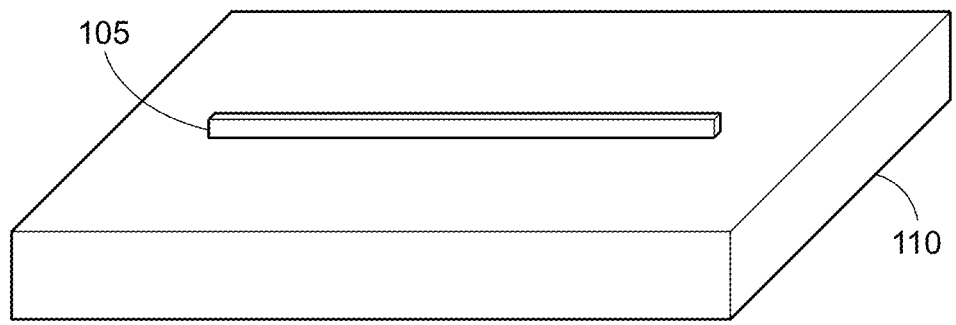
Figure 2:
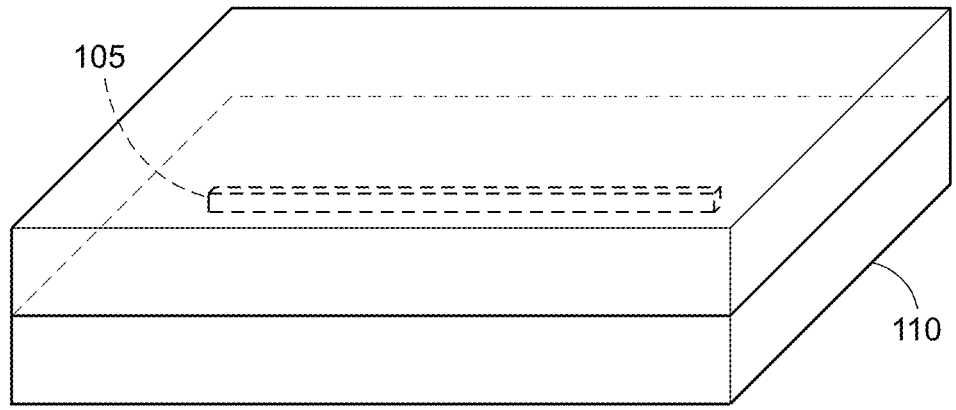
Figure 3:
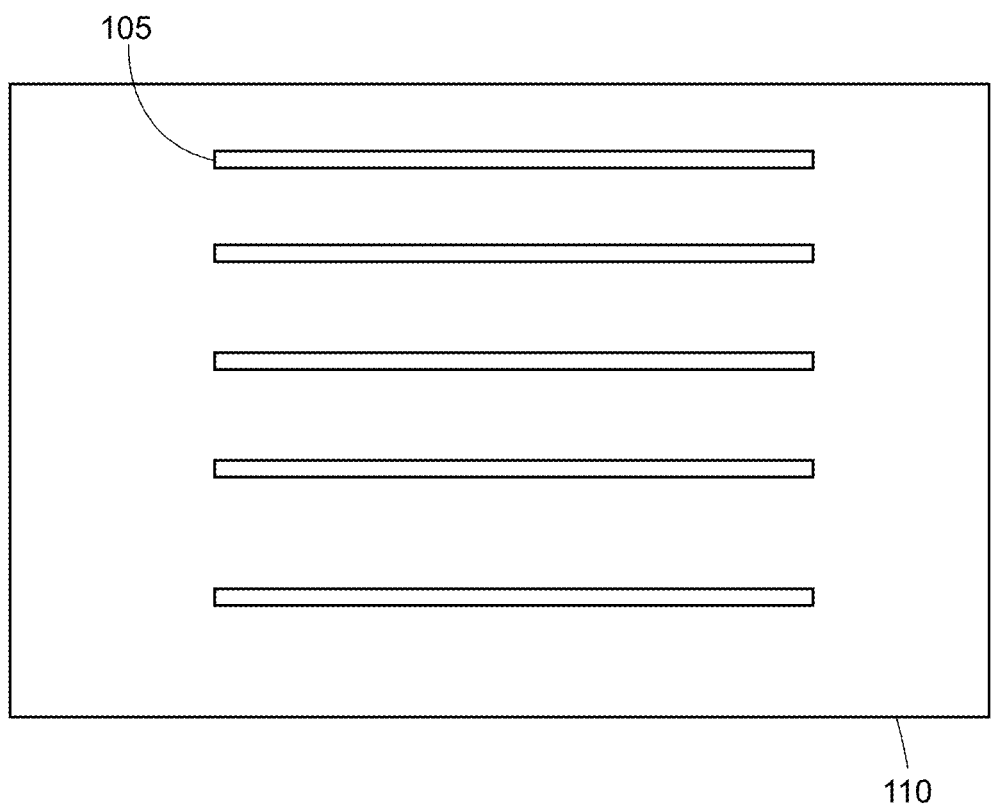
Figure 4:
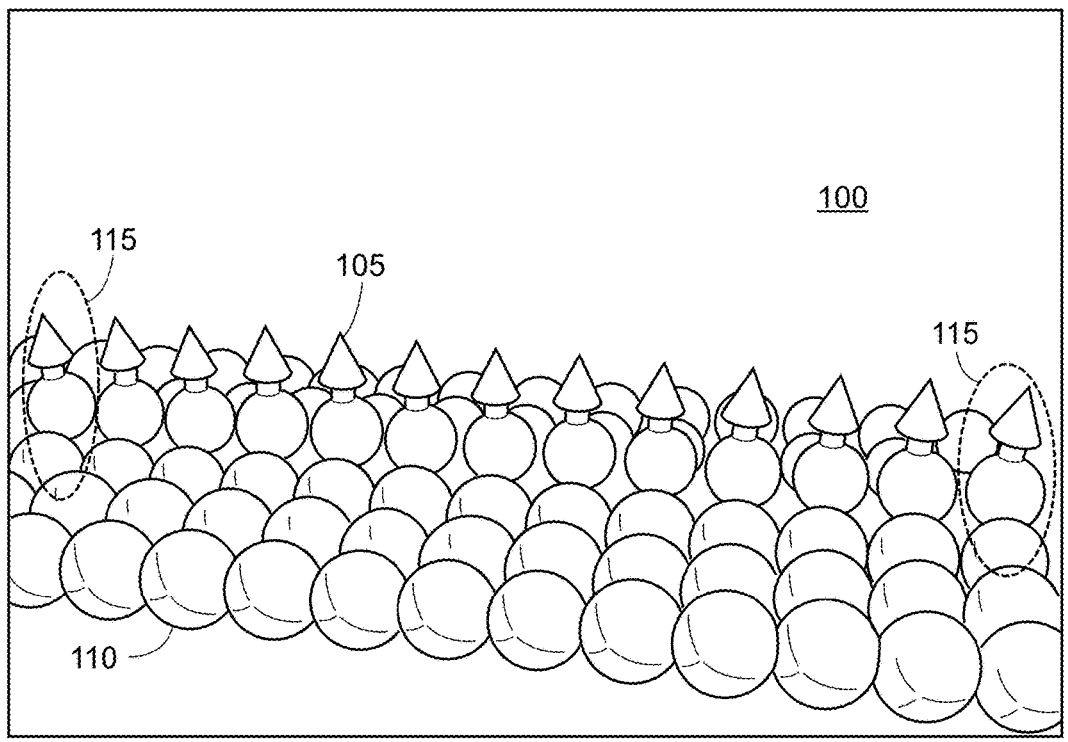
Figure 5:
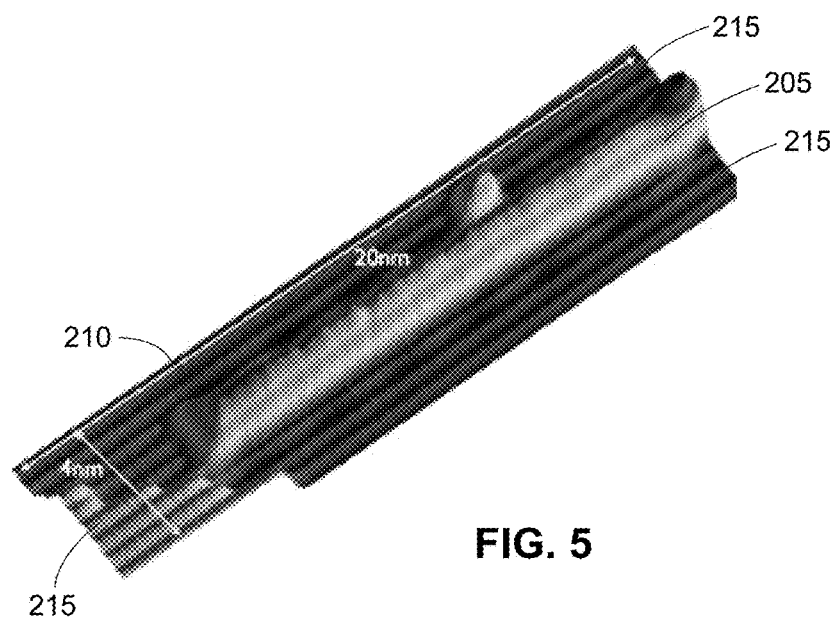

FIG. 1 is an illustration of a schematic diagram of an example magnetic topological nanowire structure including a quasi-1D magnetic nanowire placed in physical contact with the surface of a superconductor;

FIG. 2 is an illustration of a schematic diagram of an example magnetic topological nanowire structure including a quasi-1D magnetic nanowire embedded within a superconductor;

FIG. 3 is an illustration of a schematic diagram of a system of magnetic topological nanowire structures produced by placing a plurality of quasi-1D magnetic nanowires in physical contact with the surface of a superconductor;

FIG. 4 is an illustration of a schematic diagram of an atomic view of an example magnetic topological nanowire structure;

FIG. 5 is an illustration of a scanning tunneling microscope image of a chain of Fe atom self-assembled on the surface of Pb crystal using in situ evaporation of Fe on the Pb surface after the surface has been atomically cleaned using sputtering and annealing.

Figure 6:
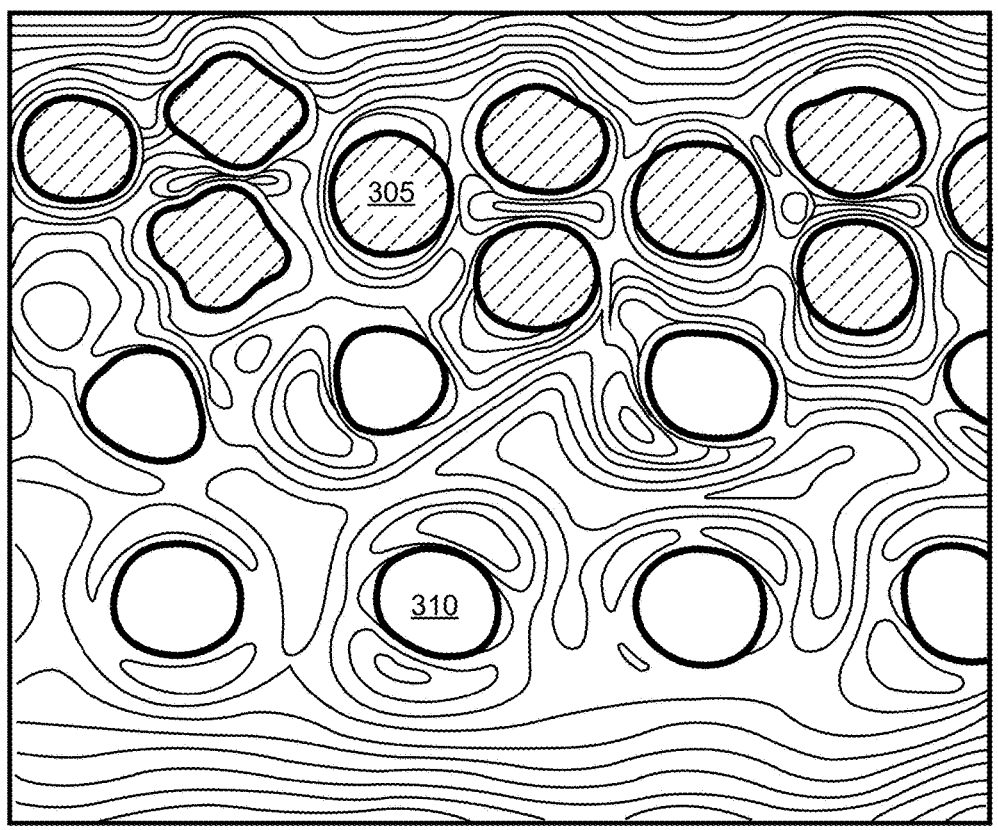

FIG. 6 is an illustration of an atomic chain of Fe atoms coupled to a surface of Pb atoms having a zigzag structure, in accordance with an example.

Figure 7:
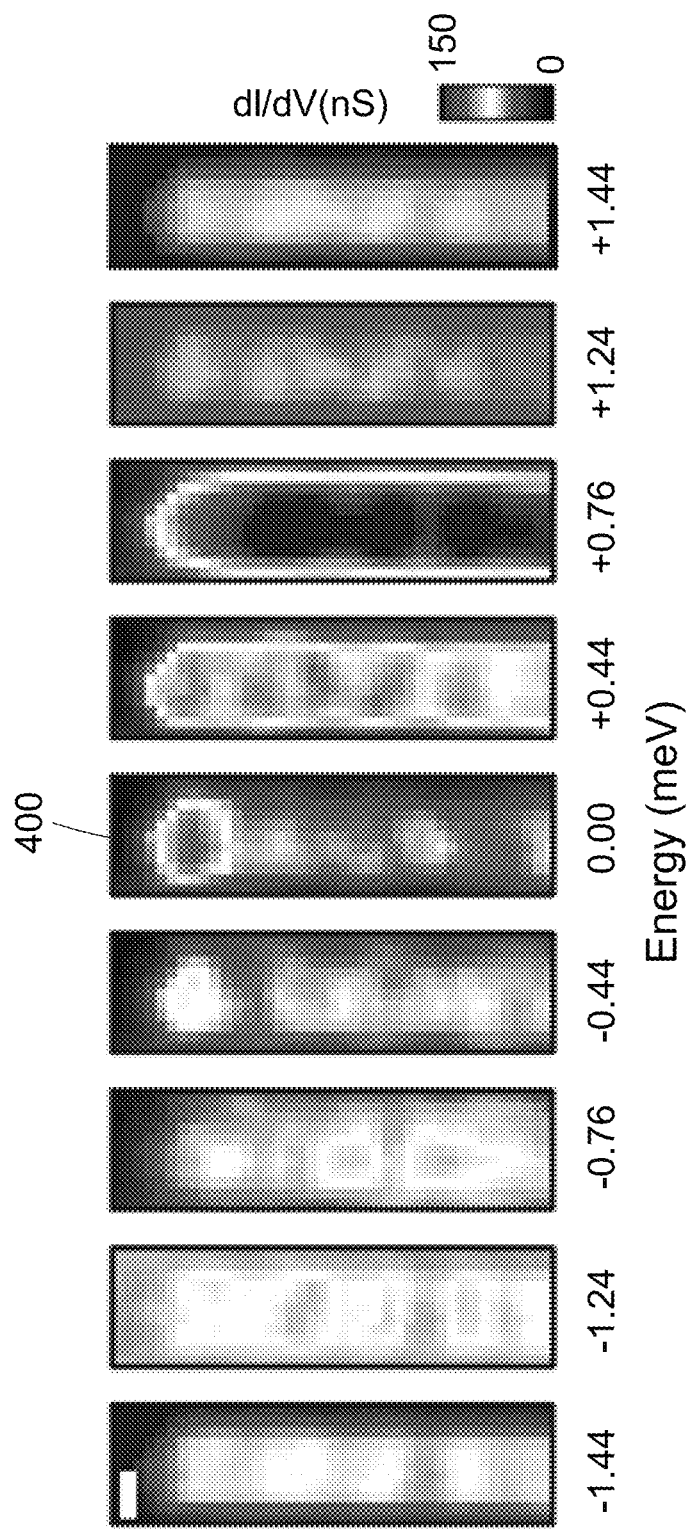

FIG. 7 depicts scanning tunneling microscope images of the electronic structure of the Fe chains on the surface of Pb. Each image panel shows the spatial structure of electronic state at different energy, where the middle panel, marked as energy equal to zero, shows the spatial structure of a zero energy state at the end of the chain.

Figure 8:
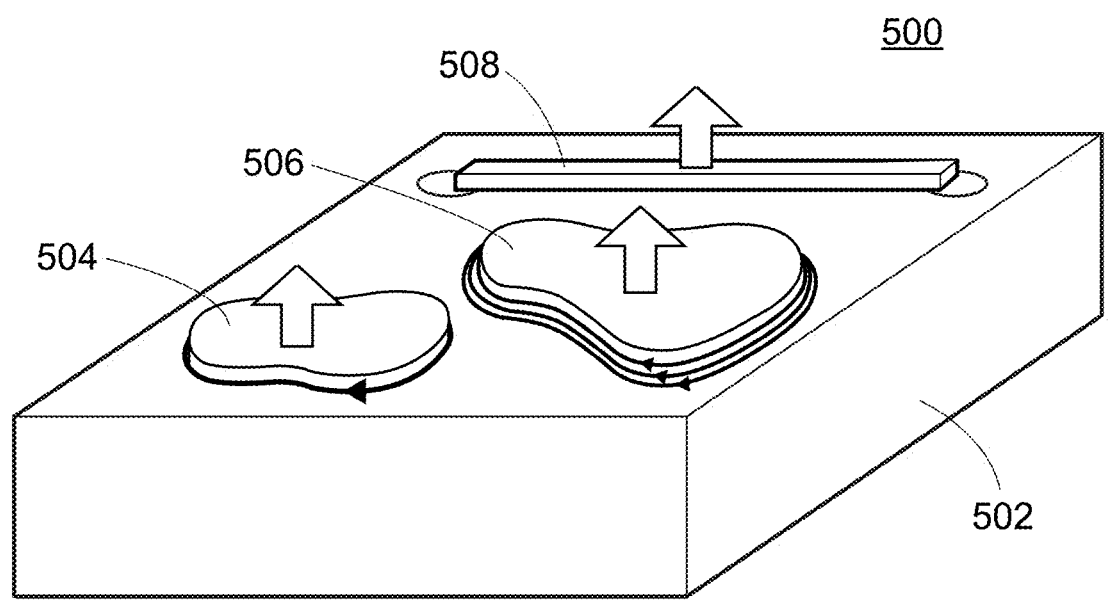

FIG. 8 illustrates a schematic diagram of an example magnetic topological structure that includes two-dimensional magnetic thin film regions and a superconductor.

DETAILED DESCRIPTION

A quantum bit, or a qubit, is a fundamental component of quantum computing. Qubits make it possible to harness the superposition principle of quantum mechanics to perform certain computations in a far more efficient manner than conventional electronics. However, qubits may be sensitive to environmental noise (decoherence) and may be reliant on behavior of surrounding materials. Isolating a qubit from environmental interference would provide a more reliable platform for quantum computing techniques. A topological qubit is protected from the adverse effect of the environment (decoherence) because of unique quantum properties of the engineered structure, which uses electronic materials in innovative ways.

The search for Majorana fermions in condensed matter systems is motivated in part by their potential use as topological qubits to perform fault-tolerant quantum computation aided by their non-Abelian characteristics. Spatially separated pairs of Majorana fermion pairs can be used to encode information in a nonlocal fashion, making them more immune to quantum decoherence. These distinct features of Majorana fermions have been proposed to be used in the development of qubits, which may make new class of quantum computing technologies possible.

Majorana fermions are predicted to localize at the edge of a magnetic topological nanowire, a state of matter that can form when a ferromagnetic system is placed in proximity to a conventional superconductor with strong spin-orbit interaction. The present application describes that such a magnetic topological nanowire system can be realized by fabricating ferromagnetic nanowires (such as iron (Fe)) on the surface of (or embedded within) a superconducting substrate (such as lead (Pb)). The present application also describes practical uses of those techniques. Such magnetic topological nanowire structures have been fabricated with the goal of realizing the topological qubit platform from simple, readily available materials.

The use of the present techniques to form a magnetic topological nanowire was demonstrated, in part, by high resolution spectroscopic imaging techniques, via a scanning tunneling microscope, which showed that the onset of superconductivity, which gaps the electronic density of states in the bulk of the Fe chains, was accompanied by the appearance of zero energy end states in the proposed magnetic topological nanowire. The spatially resolved signature of zero bias peak, to the lowest available temperatures, provides strong evidence, corroborated by other observations, for the formation of a topological phase and edge-bound Majorana fermions. In other words, there is strong empirical evidence to show that the magnetic topological nanowire of the current application settles the crucial deficiencies of the prior experiments and proposals by providing a spatially separated pair of Majorana fermions.

The magnetic topological nanowire of the current application does not require the application of an external magnetic field, gating and/or fine-tuning of the electrical properties of the quasi 1-D magnetic nanowire. Thus, the magnetic topological nanowire structure provided by the current application overcomes the various shortcomings of the previous platform for Majorana fermions based on semiconductor nanowires.

The magnetic topological nanowires of the current application are composed of a distinct combination of matter that is shown to host boundary Majorana fermions. The materials used in the combination of the present disclosure are readily accessible and amenable to repeatable fabrication. For example, various self-assembly techniques, such as nanoscale patterning, may be implemented to fabricate the magnetic topological nanowire. Thus, the magnetic topological nanowires of the present disclosure can be straightforwardly produced in mass quantities. More intricate techniques, such as moving atoms with the scanning tunneling microscope (STM), can create other wire shapes (circles, helixes, etc.) which can also be used for Majorana fermion manipulation and braiding. Moreover, these techniques and others may be used to create thin two-dimensional layers of Fe on the surface of a superconductor. For example, two-dimensional patterns can be formed by sputtering thin layers of Fe on the surface of Pb. Such configurations are then able to provide two-dimensional topological structures, including two-dimensional qubit structures.

Magnetic Topological Nanowire Structure

The present application provides a magnetic topological nanowire that produces a pair of localized Majorana fermions. Unlike all previous attempts to produce Majorana fermion pairs, the current disclosure introduces a method of fabricating a magnetic topological nanowire structure that does not require application of an external magnetic field, gating and/or fine-tuning of the properties of the structure.

The magnetic nanowire of the current disclosure allows for detection of the Majorana fermions that achieves both spatial and spectral resolution via a scanning tunneling microscope. Prior attempts to resolve the presence of Majorana fermions based on semiconductors nanowires have failed to spatially resolve the zero bias peaks in order to demonstrate that the Majorana fermions were localized at the boundary of a gapped superconducting phase, which implies that the semiconductor system fails to prove the presence of Majorana fermions. In contrast, the present system based on quasi 1-D magnetic nanowires exhibits strong localization of fermions at the boundaries of the system (i.e., strong isolation from one another). Furthermore, the localization of Majorana fermions allows the length of the magnetic topological nanowire to be orders of magnitude smaller than the lengths hypothesized for the semiconductor nanowire system.

The current application provides completely alternative methods to the prior art by placing a magnetic nanowire (e.g., a quasi-1D structure including a nanowire) on the surface (or embedded within) a superconductive substrate. For example, the magnetic atomic-chain structure may be an iron (Fe) atomic-chain, and the superconductor may be a lead (Pb) substrate. Many other combinations are also possible. In an embodiment, the topological superconductivity is enabled by the ferromagnetic interaction between Fe atoms realized at the Fe—Fe bond distance and the strong spin-orbit interaction in superconducting Pb. In this way, the system, that is, of the magnetic structure and the superconductive substrate produce a self-contained interaction resulting in a spatially separated pair of Majorana fermions.

One embodiment of the current system allows for topological superconductivity by modeling a ferromagnetic chain embedded in a superconductor (to form a magnetic topological nanowire), which can be measured by the scanning tunneling microscope (STM). The ability to spatially resolve the properties of the magnetic topological nanowire differs considerably from that of the prior art. For example, we have shown the spatial and spectroscopic signatures of the pair of Majorana fermions are located at the magnetic topological nanowire ends, which has not been achieved in the Majorana platforms based on semiconductor nanowire.

In other embodiments, non-topological phases can occur for some geometries of the ferromagnetic chain. Thus, successful embodiments (topological states) of the current system may display the following characteristics: 1) ferromagnetism on the chain placed on the superconductor, 2) inversion-symmetry breaking spin-orbit coupling in the host superconductor (or at its surface), 3) a superconducting gap in the bulk of the ferromagnetic chain, and finally 4) a localized zero bias peak (ZBP) due to the pair of Majorana fermions at the ends of the chain.

The above conditions may be over constrained by providing evidence that the system has an odd number of band crossings at $E_F$. The disappearance of edge-localized ZBPs when the underlying superconductivity is suppressed provides an additional check to show that the Majorana fermion signature is associated with superconductivity and not with other phenomena, such as the Kondo effect.

Example Magnetic Topological Nanowire

In some embodiments, the magnetic topological nanowire structure may be comprised of two elements, a quasi 1-D magnetic nanowire and a superconductor. The two elements may be coupled in various manners to create the magnetic topological nanowire structure. For example, FIG. 1 illustrates a schematic diagram of an example magnetic topological nanowire structure 100 including a quasi-1D magnetic nanowire 105 placed in physical contact with the surface of a superconductor 110. Fabrication techniques and properties of the magnetic topological nanowire 100 are described in further detail below.

FIG. 2 illustrates a schematic diagram of another embodiment of an example magnetic topological nanowire structure 100 including a quasi-1D magnetic nanowire 105 embedded within a superconductor 110. Fabrication techniques and properties of the magnetic topological nanowire 100 of the embodiment in FIG. 2 are described in further detail below.

It should be noted that although FIGS. 1 and 2 display magnetic topological nanowires created using different fabrication methods, both embodiments result in a pair of spatially resolved Majorana fermions that can be implemented in various quantum computing applications. Further, any combination of the embodiments of FIGS. 1 and 2 can be used to create a system of magnetic topological nanowire structures to be used in quantum computing applications. For example, FIG. 3 illustrates a schematic diagram of a system of magnetic topological nanowire structures produced by placing a quasi-1D magnetic nanowires 105 in physical contact with the surface of a superconductor 110. FIG. 3 illustrates an example array of qausi-1D magnetic nanowires. Nanowires can be arrayed in other configurations, e.g., with parallel nanowires as shown and another set of parallel nanowires orthogonal to those shown. In any of these configurations, when the quasi-1D magnetic nanowires are qubits, the resulting structure is a qubit-nanowire array. FIG. 8, discussed below, illustrates thin films of magnetic nanostructures on (or imbedded in) a superconductor that may be arrayed as well. In event, in any of these examples, implemented as qubit structures, the qubit structures may be addressed for operation using an array of gates and conductors (not shown) coupled to control operation of the qubits.

While the nanowires 105 are described as fabricated in physical contact with the superconductor 110, the system of magnetic topological nanowires may be produced by coupling the plurality of quasi 1-D magnetic nanowire to the superconductor using any combination of fabrication techniques (i.e., embedding or placing in physical contact) as illustrated in FIGS. 1 and 2 above.

FIGS. 1-3 are example schematic illustrations and are not intended to be limiting. For example, the size and shape of the superconductor 110 from FIGS. 1-3 can be any appropriate design for the magnetic topological nanowire structure. Further, although the quasi 1-D magnetic nanowire 105 of FIGS. 1-3 is illustrated as a generally straight line, in other embodiments the nanowire 105 may be curved, bent at an angle, in a zigzag pattern, etc., where these are examples of a quasi-1D nanowire. Further, in other embodiments the nanowire 105 may be of any length or thickness that is appropriate for the magnetic topological nanowire structure.

FIG. 4 illustrates a schematic diagram of an atomic view of an example magnetic topological nanowire structure 100. As in FIGS. 1-3, the example magnetic topological nanowire structure 100 comprises two elements, a quasi 1-D magnetic nanowire 105 and a superconductor 110. Although FIG. 4 illustrates an embodiment where the magnetic chain 105 is in physical contact with the surface of the superconductor 110, other fabrication techniques can be utilized to couple the two elements 105 and 110, such as embedding as discussed in relation to FIG. 2 above. FIG. 5, discussed below, illustrates a scanning electron microscope image of an example implementation of the techniques of FIG. 4, e.g., showing an Fe nanowire fabricated on the surface of Pb.

Once the elements 105 and 110 are coupled, no outside elements or forces are necessary to supplement the interaction to produce a spatially separated pair of Majorana fermions 115. In other words, the interaction between the superconductor 110 and the quasi 1-D magnetic nanowire 105 is self-contained, unlike the prior art which requires applied electrical gate voltages to tune the chemical potential and applied magnetic fields to supplement interactions.

In an embodiment, the quasi 1-D magnetic nanowire 105 may be an idealized ferromagnetic chain of iron (Fe) atoms. A ferromagnetic material may be used in a self-contained system due to the fixed magnetic levels of the material. The large exchange interaction in the element 105 results in a fully occupied majority spin band with the Fermi level (EF) residing in the minority spin bands. The quasi 1-D magnetic nanowire 105 may be coupled to a superconductor 110 with strong spin-orbit interaction (e.g., Pb), this coupling may cause the spin-orbit interactions to lift many of the degeneracies in the quasi 1-D magnetic nanowire's band structure, while at the same time allowing for the occurrence of p-wave superconductivity. Because only the Fe d-bands will be strongly spin-polarized, other bands are unlikely to influence the topological character of the system, whether they reside mainly on the Fe chains or on the substrate. In turn, the pair of Majorana fermions 115 produced by the system may be inherently isolated from the environment, meaning that the Majorana fermions 115 may be implemented as a topological qubit.

Remarkably, for large exchange interaction, topological superconductivity is ubiquitous to the type of band structure, occurring for nearly all values of the chemical potential. In this situation, the number of minority spin bands which cross the Fermi level is almost always odd, making the presence of Majorana fermions 115 at the ends of the chains almost guaranteed. This in turn does not require fine-tuning of the chemical potential to create the conditions for topological superconductivity and Majorana fermions, as required for the implementation based on semiconducting nanowires. The exchange magnetic coupling inherent in the chains makes the phase-space for topological superconductivity large. As a result, unlike conventional systems, the present techniques consistently produce a topological superconductor formed of Majorana fermions.

In other embodiments, the quasi 1-D magnetic nanowire 105 may be comprised of other ferromagnetic elements, such as the transition metal or lanthanide series, or any combination thereof. Although the quasi 1-D magnetic nanowire 105 in the current application will be referred to as being comprised of iron (Fe) atoms, in other embodiments the quasi 1-D magnetic nanowire 105 may also be comprised of nickel, cobalt and some rare earths (e.g., gadolinium, dysprosium), or any combination thereof.

Although the quasi 1-D magnetic nanowire 105 of FIG. 1 is illustrated as being a 1-D atomic chain, the quasi 1-D magnetic nanowire 105 may not be perfectly one-dimensional. For example, the quasi 1-D magnetic nanowire 105 may be placed in a zigzag pattern, a circular pattern, a square patter, an elliptical pattern, or any other shape that can be formed by a string or chain. Furthermore, the quasi 1-D magnetic nanowire 105 may be thicker than a single-atom chain. In other embodiments, the quasi 1-D magnetic nanowire 105 may be of a varying atomic thickness throughout the length of the chain. In other embodiments, the quasi 1-D magnetic nanowire 105 is of uniform thickness throughout.

In general, magnetic moments in quasi 1-D magnetic nanowire chains can form various configurations, including noncolliner or spiral textures. Exploring the full freedom of quasi 1-D chain geometries may create favorable conditions for noncollinear magnetic moments of adjacent atoms. For example, a quasi 1-D magnetic nanowire with a zigzag chain structure, as described above, may have a spiral magnetic texture while other quasi 1-D chain structures may produce other noncollinear textures.

In an embodiment of the current application, the superconductor 110 is an s-wave superconductor. In an embodiment, the s-wave superconductor 110 may be lead (Pb). However, in other embodiments, the superconductor can be another element such as niobium, tantalum, etc. or any other superconducting alloy.

Fabrication

To fabricate the magnetic topological nanowire, a number of different techniques, including but not limited to self-assembly and/or nanofabrication, can be used to couple a quasi-1D magnetic nanowire to a superconductor. In an example embodiment, single crystal superconducting Pb may be prepared with cycles of in situ sputtering (ejecting single atoms on the surface of a target solid) and annealing (heat treatment meant to break bonds within a solid material). To fabricate Fe chains, sub-monolayers of Fe are evaporated on the surface of Pb at room temperature, followed by a light annealing. This method results in large atomically ordered regions of the Pb surface 110 (other surfaces are also possible), as well as islands and chains of Fe atoms 105 that have nucleated on the surface.

FIG. 5 is an STM topography image of an Fe chain that has been coupled to a surface of Pb using the sputtering and annealing fabrication techniques described above. An Fe chain 205 is formed on a substrate 210 due to the atomic structure of Pb, where the single line in the middle is the Fe chain 205 that has formed due to self-assembly of Fe atoms.

In certain embodiments, depending on growth conditions, Fe chains 205 may be as long as 500 Å, usually with an Fe island in the middle. In longer Fe chains 205, the ends may be separated from the islands in the middle by atomically ordered regions that are 200 Å long. In an embodiment, the Fe chains 205 may have a height of about 2 Å and may be centered between the atomic rows of Pb 215. Approximate periodicities of 4.2 Å and 21 Å may be measured on the chain to show that the Fe chain 205 has a structure that is incommensurate with that of the underlying Pb surface.

To identify the atomic structure of the Fe chains 205, density functional theory (DFT) calculations of Fe on the Pb surface 210 show that strong Fe—Pb bonding results in a partially submerged zigzag chain of Fe atoms between Pb atom rows. FIG. 6 is an illustration of a zigzag atomic chain of Fe atoms 305 coupled to a surface of Pb atoms 310. It may be shown that among several candidate structures with the experimental periodicity, a three-layer Fe zigzag chain 305 partially submerged in Pb has the lowest energy and gives contours of constant electron density that are most consistent with the measured scanning tunneling microscope images.

A combination of spectroscopic and spin-polarized measurements with the scanning tunneling microscope may be implemented to demonstrate that Fe atomic chains 305 on Pb 310 satisfy the criteria required to demonstrate a magnetic topological nanowire structure. Furthermore, it can be shown that the zigzag Fe chains 305 in Pb 310 may be ferromagnetic, as expected given that the distance between the Fe atoms is close to that of bulk Fe.

FIG. 7 shows energy resolved scanning tunneling microscopy maps of the electronic states of Fe chains, e.g., as shown in FIG. 5, near the end of such a chain. Map 400, marked as measured at zero energy, corresponds to the spatial resolved measurements of the signature of Majorana fermion in the Fe chain fabricated on Pb. This demonstrates the spatial localization of Majorana fermion in the magnetic topological nanowires.

FIG. 8 illustrates another example schematic diagram of an example magnetic topological structure 500. The structure 500 includes a superconductor substrate 502 (e.g., an s-wave superconductor substrate form of Pb atoms). Formed therewith are two-dimensional magnetic thin film regions, e.g., islands, 504 and 506 (e.g., formed of Fe atoms). The islands 504 and 506, which maybe coupled to or embedded in the superconductor 502, produce self-contained interactions resulting in a band of Majorana fermions located and circulating around the edges of the islands. The two-dimensional thin film layers of Fe may be formed by evaporation techniques and can be shaped into any number of two-dimensional shapes or patterns depending on the desired qubit operation. Different thin film islands may include different numbers of circulating Fermion bands, as shown, for example by adjusting densities in the thin films. Further, for comparison purposes a 1D magnetic nanowire 508 is also shown formed with the superconductor substrate 502. In fact, in this way, the configuration 500 illustrates that hybrid magnetic topological structures may be formed, i.e., structures that include both one-dimensional structures with Majorana fermions at the end of the nanowire and two-dimensional (thin film) structures with a band of Majorana fermions circulating at the edge of such structures.

As used herein any reference to "some embodiments" or "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a function, process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description should be read to include one or at least one and the singular also includes the plural unless it is obvious that it is meant otherwise.

Upon reading this disclosure, those of skill in the art will appreciate still additional alternative structural and functional designs for a magnetic topological nanowire through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed:

1. A magnetic topological nanowire structure, comprising:
a superconductor; and
a quasi-1D magnetic nanowire that is coupled to or embedded in the superconductor to produce a self-contained interaction resulting in a spatially separated pair of Majorana fermions, wherein the pair of Majorana fermions correspond to the magnetic topological nanowire structure and wherein each of the pair of the Majorana fermions are located near a respective endpoint of the quasi-1D magnetic nanowire.

2. The magnetic topological nanowire structure of claim 1, wherein the resulting pair of Majorana fermions form a topological qubit.

3. The magnetic topological nanowire structure of claim 1, wherein the quasi-1D nanowire is ferromagnetic.

4. The magnetic topological nanowire structure of claim 1, wherein the quasi-1D magnetic nanowire has a non-collinear or spiral magnetic texture.

5. The magnetic topological nanowire structure of claim 4, wherein the quasi-1D magnetic nanowire is comprised of elements from the transition metal or lanthanide series or a combination thereof.

6. The magnetic topological nanowire structure of claim 1, wherein the quasi-1D magnetic nanowire is an atomic chain.

7. The magnetic topological nanowire structure of claim 6, wherein the atomic chain of the quasi-1D magnetic nanowire comprises a thickness of one or more atoms.

8. The magnetic topological nanowire structure of claim 1, wherein the superconductor is an s-wave superconductor with spin-orbit coupling.

9. The magnetic topological nanowire structure of claim 8, wherein the superconductor comprises an element or binary alloy of lead, niobium, or tantalum.

10. The magnetic topological nanowire structure of claim 8, wherein the superconductor comprises an element that results in a s-wave superconductor.

11. The magnetic topological nanowire structure of claim 1, wherein coupling the quasi-1 D magnetic nanowire to the superconductor comprises embedding the quasi-1 D nanowire within the superconductor.

12. The magnetic topological nanowire structure of claim 1, wherein coupling the quasi-1 D magnetic nanowire to the superconductor comprises placing the quasi-1 D nanowire in physical contact with the exterior of the superconductor.

13. The magnetic topological nanowire structure of claim 12, wherein the quasi-1 D magnetic nanowire is placed in a zigzag, circular, ellipse, cross or square pattern on the surface of the superconductor.

14. A magnetic topological structure, comprising:
a superconductor; and
a two-dimensional magnetic thin film region coupled to or embedded in the superconductor to produce self-contained interactions resulting in a band of Majorana fermions circulating around the edge of the two-dimensional thin film region.

15. The magnetic topological structure of claim 14, wherein the two-dimensional magnetic thin film region is ferromagnetic.

\* \* \* \* \*